US011390735B2

(12) United States Patent
Guan et al.

(10) Patent No.: US 11,390,735 B2
(45) Date of Patent: Jul. 19, 2022

(54) THERMOSETTING RESIN COMPOSITION AND PREPREG AND METAL FOIL-COVERED LAMINATE MADE USING SAME

(71) Applicant: Shengyi Technology Co., Ltd., Guangdong (CN)

(72) Inventors: Chiji Guan, Guangdong (CN); Xianping Zeng, Guangdong (CN); Guangbing Chen, Guangdong (CN); Haosheng Xu, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 37 days.

(21) Appl. No.: 16/632,584

(22) PCT Filed: Oct. 19, 2017

(86) PCT No.: PCT/CN2017/106827
§ 371 (c)(1),
(2) Date: Jan. 21, 2020

(87) PCT Pub. No.: WO2019/024253
PCT Pub. Date: Feb. 7, 2019

(65) Prior Publication Data
US 2020/0157332 A1 May 21, 2020

(30) Foreign Application Priority Data

Aug. 4, 2017 (CN) .......................... 201710661518.3

(51) Int. Cl.
*C08L 25/08* (2006.01)
*C08J 5/24* (2006.01)
*C08L 83/04* (2006.01)
*C09D 183/04* (2006.01)
*H05K 1/02* (2006.01)
*C09D 125/08* (2006.01)
*B32B 5/02* (2006.01)
*B32B 5/26* (2006.01)
*H05K 1/03* (2006.01)
*C08G 77/00* (2006.01)

(52) U.S. Cl.
CPC .............. *C08L 25/08* (2013.01); *B32B 5/022* (2013.01); *B32B 5/024* (2013.01); *B32B 5/26* (2013.01); *C08J 5/24* (2013.01); *C08L 83/04* (2013.01); *C09D 125/08* (2013.01); *C09D 183/04* (2013.01); *H05K 1/024* (2013.01); *H05K 1/0366* (2013.01); *B32B 2255/02* (2013.01); *B32B 2255/205* (2013.01); *B32B 2260/021* (2013.01); *B32B 2260/046* (2013.01); *B32B 2262/101* (2013.01); *B32B 2307/204* (2013.01); *B32B 2307/306* (2013.01); *B32B 2307/558* (2013.01); *B32B 2307/7265* (2013.01); *B32B 2457/08* (2013.01); *C08G 77/70* (2013.01); *C08J 2325/08* (2013.01); *C08J 2383/07* (2013.01); *C08J 2425/08* (2013.01); *C08J 2483/07* (2013.01); *C08L 2201/08* (2013.01); *H05K 2201/029* (2013.01); *H05K 2201/0293* (2013.01)

(58) Field of Classification Search
CPC .... C08F 212/36; C08F 212/06; C08F 236/06; B32B 15/082; B32B 15/14; B32B 5/022; B32B 5/024; B32B 2457/08; C08J 5/24; C08L 9/00; C08L 23/20; C08K 3/013; C08K 5/0066
See application file for complete search history.

(56) References Cited

U.S. PATENT DOCUMENTS

2007/0129502 A1* 6/2007 Kawabe ................ C08F 290/06
525/391
2015/0313012 A1* 10/2015 Chen ....................... B32B 15/20
442/117
2016/0244610 A1* 8/2016 Chen ....................... C08L 71/12

FOREIGN PATENT DOCUMENTS

| CN | 1914239 A | 2/2007 |
|---|---|---|
| CN | 101643565 A | 2/2010 |
| CN | 102471580 A | 5/2012 |
| CN | 102807658 A | 12/2012 |

(Continued)

OTHER PUBLICATIONS

Machine Translation of JP 2016/190899 A (Year: 2016).*

(Continued)

*Primary Examiner* — Callie E Shosho
*Assistant Examiner* — Bethany M Miller
(74) *Attorney, Agent, or Firm* — Norton Rose Fulbright US LLP; James R. Crawford

(57) ABSTRACT

A thermosetting resin composition and a prepreg and a metal foil-covered laminate made using same, the thermosetting resin composition comprising component (A): a solvent-soluble polyfunctional vinyl aromatic copolymer, the copolymer being a poly-functional vinyl aromatic copolymer having a stoctoal unit derived from monomers comprising divinyl aromatic compound (a) and ethyl vinyl aromatic compound (b); and component (B): a vinyl-containing organic silicone resin. The prepreg and metal foil-covered laminate made from the thermosetting resin composition have good toughness, and maintain a high glass transition temperature, a low water absorption, dielectric properties and humidity resistance, being suitable for the field of high-frequency and high-speed printed circuit boards and the processing of multilayer printed circuit boards.

5 Claims, No Drawings

(56) References Cited

FOREIGN PATENT DOCUMENTS

| | | | | |
|---|---|---|---|---|
| CN | 102993683 A | | 3/2013 | |
| CN | 103172803 A | | 6/2013 | |
| CN | 106609039 A | | 5/2017 | |
| CN | 106916293 A | | 7/2017 | |
| JP | 2006070136 A | | 3/2006 | |
| JP | 2006274169 A | * | 10/2006 | |
| JP | 2007262191 A | | 10/2007 | |
| JP | 2010037398 A | | 2/2010 | |
| JP | 2016190899 A | * | 11/2016 | |
| KR | 20070009572 A | | 1/2007 | |
| TW | 200536862 A | | 11/2005 | |
| WO | WO-2015169002 A1 | * | 11/2015 | ............ B32B 15/08 |
| WO | 2016104748 A1 | | 6/2016 | |
| WO | 2017067124 A1 | | 4/2017 | |

OTHER PUBLICATIONS

Machine Translation of JP 2006/274169 A (Year: 2006).*
International Search Report issued in PCT/CN2017/106827 dated Apr. 28, 2018.

* cited by examiner

THERMOSETTING RESIN COMPOSITION AND PREPREG AND METAL FOIL-COVERED LAMINATE MADE USING SAME

This application is a national phase under 35 U.S.C. § 371 of International Application No. PCT/CN2017/106827 filed Oct. 19, 2017, which claims the benefit of priority from Chinese Patent Application No. 201710661518.3, filed on Aug. 4, 2017 each of which is hereby incorporated by reference in its entirety.

TECHNICAL FIELD

The present invention belongs to the technical field of copper clad laminates, and relates to a thermosetting resin composition, a prepreg and a metal foil clad laminate prepared from the same.

BACKGROUND ART

With the development of high-performance, high-functionalization and networking of computers and information communication equipment, the operation signals tend to be high-frequency in recent years in order to transmit and process large-capacity information at high speed. Thus there is a demand for the material of circuit substrates. There has been rapid development, especially in those electronic devices that use broadband, such as mobile communication devices.

Among the current materials used for printed circuit boards, epoxy resins having excellent adhesion characteristics are widely used. However, the epoxy resin circuit board generally has a high dielectric constant and dielectric loss tangent (the dielectric constant Dk being greater than 4, dielectric loss tangent Df being about 0.02) and insufficient high frequency characteristics, so that it cannot meet the requirements of high frequency signal. Therefore, it is necessary to develop a resin excellent in dielectric properties, i.e. a resin having a low dielectric constant and a dielectric loss tangent. For a long time, those skilled in the art have studied thermosetting polyphenylene ether resins, bismaleimide resins, vinyl benzyl ether resins, hydrocarbon resins, etc., which have good dielectric properties. It is well known that the curable crosslinking hydrocarbon resin (polyolefin resin) has a low dielectric loss tangent Df (comparable to polytetrafluoroethylene resin), and has good fluidity, so as to attract a large number of in-depth studies by the majority of technicians. However, it cannot meet the process requirements of high-multilayer printed wiring boards due to its insufficient heat resistance, and it needs to be used together with other heat-resistant resins.

TW200536862A discloses that, in the organic solvent system, 20 to 100 mol. % of a divinyl aromatic compound and, if necessary, other monomers (such as ethyl vinyl aromatic compound, and other monomers) were added at a reaction temperature of 20 to 120° C. in the presence of a Lewis acid catalyst and an initiator, and polymerized to prepare a soluble polyfunctional vinyl aromatic copolymer having a controlled molecular weight. The resin can be used in high friction fields related to electronic substrates and the like, and has good heat resistance and processability. Although the electronic circuit substrates prepared by using the copolymer have better dielectric properties and better heat resistance, it also has obvious defects of high brittleness. High brittleness has a large negative impact on subsequent PCB processing (serious wear of the drill, delamination of the sheet, and large halo after drilling, resulting in poor CAF), so that it cannot meet the requirements for the fabrication of high-multilayer printed circuit boards.

CN1914239A discloses copolymerization using a terminal vinyl-modified polyphenylene ether and a soluble polyfunctional vinyl aromatic copolymer to produce a copper clad laminate having excellent chemical resistance, dielectric properties and heat resistance. In order to improve the toughness of copper clad laminates, it is pointed out that one or two or more thermoplastic resins may be added, but the addition of a thermoplastic resin will greatly lower the glass transition temperature of the substrate. In addition, the thermoplastic resin and the cured product may be incompatible, resulting in phase separation of the substrate, greatly deteriorating the heat and humidity resistance of the substrate, and causing the high-multilayer printed circuit board to be delaminated after the heat treatment of the lead-free reflow soldering, so that it cannot be used.

CN103172803A discloses preparing an optical article having excellent optical properties such as refractive index and high light transmittance, heat resistance and processability after the composition containing the acryl-containing silicone resin and the initiator was cured by using a soluble polyfunctional copolymer. However, it is not disclosed that the resin composition can be used for a copper clad laminate and a prepreg. That is to say, after a copper clad laminate was prepared by curing the resin composition, the dielectric properties (dielectric loss tangent Df) thereof were remarkably deteriorated (the resin composition comprises the acryl-based organosilicon resin, and the acryl-containing organosilicon resin has a relatively higher polarity, so that it cannot meet the requirements of high-frequency signal transmission.

Therefore, it is desirable in the art to obtain a resin composition which makes of copper clad laminates have good comprehensive properties of toughness, dielectric properties, and heat and humidity resistance.

CONTENTS OF THE INVENTION

In view of the deficiencies of the prior art, it is an object of the present invention to provide a thermosetting resin composition, a prepreg and a metal foil-clad laminate produced using the same.

To achieve this, the present invention discloses the following technical solutions.

In one aspect, the present invention provides a thermosetting resin composition, wherein the thermosetting resin composition comprises component (A) a solvent-soluble polyfunctional vinyl aromatic copolymer having a structural unit derived from monomers comprising divinyl aromatic compound (a) and ethyl vinyl aromatic compound (b), comprising 20 mol. % or more of repeating units derived from divinyl aromatic compound (a), wherein the molar fraction of the vinyl group-containing structural unit derived from the divinyl aromatic compound (a) represented by the following formulae (a1) and (a2) satisfies (a1)/[(a1)+(a2)]≥0.5; the polystyrene-equivalent number average molecular weight Mn measured by gel permeation chromatography is 600 to 30,000; and the ratio of the weight average molecular weight Mw to the number average molecular weight Mn is 20.0 or less,

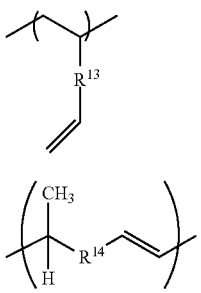

Formula (a1)

Formula (a2)

wherein $R_{13}$ represents an aromatic hydrocarbon group having 6 to 30 carbon atoms; $R_{14}$ represents an aromatic hydrocarbon group having 6 to 30 carbon atoms;

and component (B) a vinyl-containing organosilicon resin.

The resin component of the thermosetting resin composition of the present invention does not contains a polar hydroxyl group, and will not generate a polar group such as a secondary hydroxyl group during the curing process, thereby ensuring low water absorption of the circuit substrate and excellent dielectric properties. By using the vinyl-containing organosilicon resin as a crosslinking agent for a solvent-soluble polyfunctional vinyl aromatic copolymer, the resin composition has a high crosslinking density after curing, which remarkably improves the brittleness of the soluble polyfunctional vinyl aromatic copolymer. The circuit substrate prepared thereby has better toughness, improves the drilling processability of the PCB, and is beneficial to improving the reliability of the multilayer printed circuit board.

Preferably, the vinyl-containing organosilicon resin is selected from the group consisting of linear vinyl organosilicon resin, cyclic vinyl resin, MQ vinyl organosilicon resin, MT vinyl organosilicon resin, MTQ vinyl organosilicon resin, MDT vinyl organosilicon resin, MDQ vinyl organosilicon resin, TT vinyl organosilicon resin and TQ vinyl organosilicon resin, or a combination of at least two selected therefrom, preferably linear vinyl organosilicon resin and/or cyclic vinyl resin.

Preferably, the linear vinyl organosilicon resin has the following structure of

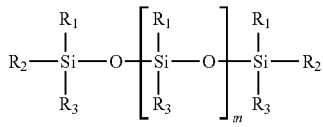

wherein $R_1$, $R_2$ and $R_3$ are identical or different alkyl or phenyl groups having 8 or less (e.g. 8, 7, 6, 5, 4, 3, 2 or 1) carbon atoms, or vinyl-containing organic functional groups having 10 or less (e.g. 10, 9, 8, 7, 6, 5, 4, 3, 2 or 1) carbon atoms; m is an integer of 5-100 (e.g. m is selected from the group consisting of 5, 7, 9, 15, 22, 32, 38, 48, 50, 61, 72, 81, 90, 92 and 100, and the like).

In the present invention, a typical but non-limiting example of the linear vinyl organosilicon resin is a linear vinyl organosilicon resin having the trade name of DMS-V05 from Gelest, i.e. $R_1$, $R_2$ and $R_3$ in the structural formula as described above are respectively methyl, vinyl and methyl. For the DMS-V05 resin, the molecular weight contained therein is a distribution. The molecular weight is large or small. In a strict sense, the m values corresponding to different molecular weights are different, and are a range rather than a value. In the laboratory, the molecular weight of the polymer is generally determined by gel chromatography GPC. The obtained number average molecular weight Mn, or weight average molecular weight Mw, or viscosity average molecular weight Mp is a relative value. Therefore, for the DMS-V05 resin, the m value corresponding to the molecular weight of the resin cannot be given. The detection was carried out by a GPC apparatus using toluene as a mobile phase, and the molecular weight of the resin was Mn=800.

Preferably, the cyclic vinyl resin has the structure of

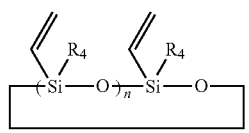

wherein $R_4$ is an alkyl group having 12 or less (e.g. 12, 11, 10, 9, 8, 7, 6, 5, 4, 3, 2 or 1) carbon atoms; n is an integer of 2-10 (e.g. 2, 3, 4, 5, 6, 7, 8, 9 or 10).

In the present invention, a typical but non-limiting example of the cyclic vinyl organosilicon resin is a cyclic vinyl organosilicon resin having the trade name WD-V4 of Wuda Silicon, i.e. R4 is methyl group in the structural formula as described above; n=2.

Preferably, the MQ organosilicon resin represents a compound having the general formula of

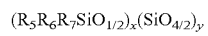

wherein 1≤x≤100 (e.g. x may be 1, 3, 5, 8, 10, 15, 20, 35, 40, 45, 50, 60, 70, 80, 90 or 100); 1≤y≤100 (e.g. y may be 1, 3, 5, 8, 10, 15, 20, 35, 40, 45, 50, 60, 70, 80, 90 or 100); 2≤x+y≤200 (e.g. 2≤x+y≤10, 15≤x+y≤30, 40≤x+y≤52, 55≤x+y≤68, 70≤x+y≤82, 89≤x+y≤105, 121≤x+y≤153, 157≤x+y≤175, 182≤x+y≤193, 195≤x+y≤200 and the like; more specifically x+y may be 2, 3, 5, 8, 10, 15, 20, 35, 40, 45, 50, 60, 70, 80, 90, 100, 120, 150, 180 or 200), and 0.1≤x/y≤4 (e.g., 0.1≤x/y≤0.9, 1≤x/y≤2, or 3≤x/y≤4 and the like; more specifically, e.g. x/y may be 0.1, 0.5, 0.8, 1, 1.2, 1.5, 1.8, 2, 2.5, 3, 3.5 or 4); at least one of $R_5$, $R_6$ and $R_7$ is a vinyl-containing organic functional group, and the remaining two are independently selected from the group consisting of substituted or unsubstituted C1-C8 linear chain alkyl group, substituted or unsubstituted C1-C8 branched chain alkyl group and substituted or unsubstituted phenyl group.

In the present invention, a typical but non-limiting example of the MQ vinyl organosilicon resin is the resin having the trade name of DY-VMQ102 from Shandong Dayi Chemical Co., Ltd. That is to say, $R_5$, $R_6$ are $R_7$ are respectively a methyl group, a methyl group and a vinyl group in the structural formula of the MQ vinyl organosilicon resin above. The detection was carried out by a GPC apparatus using toluene as a mobile phase, and the molecular weight of the resin was Mn=2632.

Preferably, the MT vinyl organosilicon resin having the following structure

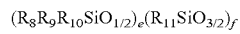

wherein 3≤e≤100 (e.g. e may be 1, 3, 5, 8, 10, 15, 20, 35, 40, 45, 50, 60, 70, 80, 90 or 100); 1≤f≤100 (e.g. f may be 1, 3, 5, 8, 10, 15, 20, 35, 40, 45, 50, 60, 70, 80, 90 or100); 4≤e+f≤200 ((e.g. 2≤e+f≤9, 10≤e+f≤25, 40≤e+f≤52, 55≤e+f≤68, 70≤e+f≤82, 89≤e+f≤105, 121≤e+f≤153, 157≤e+f≤175, 182≤e+f≤193, 195≤e+f≤200 and the like; more specifically, e+f may be 2, 3, 5, 8, 10, 15, 20, 35, 40, 45, 50, 60, 70, 80, 90, 100, 120, 150, 180 or 200), and 0.1≤e/f≤3 (e.g. 0.1≤e/f≤0.9, 1≤e/f≤1.8 or 2≤e/f≤3 and the like; more specifically, e/f may be 0.1, 0.5, 0.8, 1, 1.2, 1.5, 1.8, 2, 2.5, 2.8 or 3); $R_8$, $R_9$, $R_{10}$ and $R_{11}$ are each independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_8$, $R_9$, $R_{10}$ and $R_{11}$ is a substituted or unsubstituted C2-C10 vinyl-containing organic functional group.

In the present invention, a typical but non-limiting example of the MT vinyl organosilicon resin is the self-made V-10. That is to say, $R_8$, $R_9$, $R_{10}$ and $R_{11}$ in the structural formula as described above are respectively vinyl, methyl, methyl and phenyl. For the V10 resin, the molecular weight therein shows a distribution comprising small and large molecular weights. In a strict sense, the e and f values corresponding to different molecular weights are different, and are a range rather than a value. In the laboratory, the molecular weight of the polymer is generally determined by gel chromatography GPC. The obtained number average molecular weight Mn, or weight average molecular weight Mw, or viscosity average molecular weight Mp is a relative value. Therefore, for the V10 resin, the e and f values corresponding to the molecular weight of the resin cannot be given. The detection was carried out by a GPC apparatus using toluene as a mobile phase, and the molecular weight of the resin was Mn=2130.

Preferably, the MTQ vinyl organosilicon resin having the following structure $$(R_{12}R_{13}R_{14}SiO_{1/2})_g(R_{15}SiO_{3/2})_h(SiO_{4/2})_i$$

wherein 1≤g≤100 (e.g. g may be 1, 3, 5, 8, 10, 15, 20, 35, 40, 45, 50, 60, 70, 80, 90 or 100); 1≤h≤100 (e.g. h may be 1, 3, 5, 8, 10, 15, 20, 35, 40, 45, 50, 60, 70, 80, 90 or 100); 1≤i≤100 (e.g. i may be 1, 3, 5, 8, 10, 15, 20, 35, 40, 45, 50, 60, 70, 80, 90 or 100), and 3≤g+h+i≤300 (e.g. 3≤g+h+i≤10, 15≤g+h+i≤22, 31≤g+h+i≤50, 52≤g+h+i≤70, 72≤g+h+i≤85, 90≤g+h+i≤100 and the like; more specifically, e.g. g+h+i may be 3, 5, 8, 10, 15, 20, 35, 40, 45, 50, 60, 70, 80, 90, 100, 120, 150, 180, 200, 250, 280 or 300); $R_{12}$, $R_{13}$, $R_{14}$ and $R_{15}$ are independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_{12}$, $R_{13}$, $R_{14}$ and $R_{15}$ is a substituted or unsubstituted C2-C10 vinyl-containing organic functional group.

In the present invention, a typical but non-limiting example of the MTQ vinyl organosilicon resin is the self-made V-20. That is to say, $R_{12}$, $R_{13}$, $R_{14}$ are $R_{15}$ are respectively vinyl, methyl, methyl and phenyl in the structural formula of the MTQ vinyl organosilicon resin above. The detection was carried out by a GPC apparatus using toluene as a mobile phase, and the molecular weight of the resin was Mn=1980.

Preferably, the MDT vinyl organosilicon resin having the following structure $$(R_{16}R_{17}R_{18}SiO_{1/2})_j(R_{19}R_{20}SiO_{3/2})_k(R_{21}SiO_{3/2})_l$$

wherein 1≤j≤100 (e.g. j may be 1, 3, 5, 8, 10, 15, 20, 35, 40, 45, 50, 60, 70, 80, 90 or 100); 1≤k≤100 (e.g. k may be 1, 3, 5, 8, 10, 15, 20, 35, 40, 45, 50, 60, 70, 80, 90 or 100); 1≤l≤100 (e.g. l may be 1, 3, 5, 8, 10, 15, 20, 35, 40, 45, 50, 60, 70, 80, 90 or 100), and 3≤j+k+l≤300 (e.g. 3≤j+k+l≤10, 15≤j+k+l≤22, 31≤j+k+l≤50, 52≤j+k+l≤70, 72≤j+k+l≤85, 90≤j+k+l≤100 and the like; more specifically, e.g. j+k+l may be 3, 5, 8, 10, 15, 20, 35, 40, 45, 50, 60, 70, 80, 90, 100, 120, 150, 180, 200, 250, 280 or 300); $R_{16}$, $R_{17}$, $R_{18}$, $R_{19}$, $R_{20}$ and $R_{21}$ are independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_{16}$, $R_{17}$, $R_{18}$, $R_{19}$, $R_{20}$ and $R_{21}$ is a substituted or unsubstituted C2-C10 vinyl-containing organic functional group.

In the present invention, a typical but non-limiting example of the MDT vinyl organosilicon resin is the self-made V-30. That is to say, $R_{16}$, $R_{17}$, $R_{18}$, $R_{19}$, $R_{20}$ and $R_{21}$ are respectively vinyl, methyl, methyl, methyl, methyl and phenyl in the structural formula of the MDT vinyl organosilicon resin above. The detection was carried out by a GPC apparatus using toluene as a mobile phase, and the molecular weight of the resin was Mn=1835.

Preferably, the MDQ vinyl organosilicon resin having the following structure $$(R_{22}R_{23}R_{24}SiO_{1/2})_p(R_{25}R_{26}SiO_{3/2})_q(SiO_{4/2})_s$$

wherein 1≤p≤100 (e.g. p may be 1, 3, 5, 8, 10, 15, 20, 35, 40, 45, 50, 60, 70, 80, 90 or 100); 1≤q≤100 (e.g. q may be 1, 3, 5, 8, 10, 15, 20, 35, 40, 45, 50, 60, 70, 80, 90 or 100); 1≤s≤100 (e.g. s may be 1, 3, 5, 8, 10, 15, 20, 35, 40, 45, 50, 60, 70, 80, 90 or 100), and p+q+s≤300 (e.g. 3≤p+q+s≤11, 13≤p+q+s≤21, 32≤p+q+s≤51, 52≤p+q+s≤72, 75≤p+q+s≤82, 88≤p+q+s≤100 and the like; more specifically, e.g. p+q+s may be 3, 5, 8, 10, 15, 20, 35, 40, 45, 50, 60, 70, 80, 90, 100, 120, 150, 180, 200, 250, 280 or 300); $R_{22}$, $R_{23}$, $R_{24}$, $R_{25}$ and $R_{26}$ are independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_{22}$, $R_{23}$, $R_{24}$, $R_{25}$ and $R_{26}$ is a substituted or unsubstituted C2-C10 vinyl-containing organic functional group.

In the present invention, a typical but non-limiting example of the MDQ vinyl organosilicon resin is V-40. That is to say, $R_{22}$, $R_{23}$, $R_{24}$, $R_{25}$ and $R_{26}$ are respectively vinyl, methyl, methyl and phenyl in the structural formula of the MDQ vinyl organosilicon resin above. The detection was carried out by a GPC apparatus using toluene as a mobile phase, and the molecular weight of the resin was Mn=2514.

Preferably, the TT vinyl organosilicon resin having the following structure $$(R_{27}SiO_{3/2})_t$$

wherein 6≤t≤12, and t is an even number (e.g. t is 6, 8, 10 or 12); $R_{27}$ is a substituted or unsubstituted C2-C10 vinyl-containing organic functional group.

In the present invention, a typical but non-limiting example of the TT vinyl organosilicon resin is the resin having the trade name of S12836 from Zhengzhou Alpha. That is to say, $R_{27}$ is vinyl in the structural formula of the TT vinyl organosilicon resin above.

Preferably, the TQ vinyl organosilicon resin having the following structure

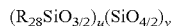

wherein 4≤u≤100 (e.g. u may be 4, 5, 8, 10, 15, 20, 35, 40, 45, 50, 60, 70, 80, 90 or 100); 1≤v≤100 (e.g. v may be 1, 3, 5, 8, 10, 15, 20, 35, 40, 45, 50, 60, 70, 80, 90 or 100), and 4≤u/v≤10 (e.g. u/v may be 4, 4.5, 5, 5.5, 6, 7, 8, 9 or 10); $R_{28}$ is a substituted or unsubstituted C2-C10 vinyl-containing organic functional group.

In the present invention, a typical but non-limiting example of the TQ vinyl organosilicon resin is V-50. That is, R28 therein is vinyl. The detection was carried out by a GPC apparatus using toluene as a mobile phase, and the molecular weight of the resin was Mn=1900.

In the present invention, the substituted or unsubstituted C1-C8 linear alkyl group represents a substituted or unsubstituted C1, C2, C3, C4, C5, C6, C7 or C8 linear alkyl group; substituted or unsubstituted C1-C8 branched alkyl group represents a substituted or unsubstituted C1, C2, C3, C4, C5, C6, C7 or C8 branched alkyl group; said substituted or unsubstituted C2-C10 vinyl-containing organic functional group refers to a vinyl group-containing organic functional group of a substituted or unsubstituted C2, C3, C4, C5, C6, C7, C8, C9 or C10.

Preferably, in the thermosetting resin composition, the compounding amount of the component (A) is 10 to 98 wt. % (e.g. 10 wt. %, 15 wt. %, 20 wt. %, 25 wt. %, 28 wt. %, 30 wt. %, 35 wt. %, 38 wt. %, 40 wt. %, 50 wt. %, 60 wt. %, 70 wt. %, 80 wt. %, 90 wt. %, 95 wt. % or 98 wt. %), and the compounding amount of the component (B) is 2 to 90 wt. % (e.g. 2 wt. %, 5 wt. %, 8 wt. %, 10 wt. %, 15 wt. %, 20 wt. %, 25 wt. %, 30 wt. %, 40 wt. %, 50 wt. %, 60 wt. %, 70 wt. %, 80 wt. % or 90 wt. %) based on the total weight of the components (A) and (B). Preferably, the compounding amount of the component (A) is 30 to 90 wt. %, and the compounding amount of the component (B) is 10 to 70 wt. %.

In the thermosetting resin composition provided by the present invention, the component (A) is a soluble polyfunctional vinyl aromatic copolymer. In the copolymer, the main chain skeleton of the soluble polyfunctional vinyl aromatic copolymer has an indane structure represented by the following formula (a3)

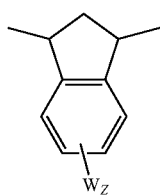

Formula (a3)

wherein W represents a saturated or unsaturated aliphatic hydrocarbon group or an aromatic hydrocarbon group, or an aromatic ring or a substituted aromatic ring fused to a benzene ring; Z is an integer of 0 to 4 (e.g. 0, 1, 2, 3, or 4).

Preferably, the component (A) is a soluble polyfunctional vinyl aromatic copolymer containing a structural unit of monovinyl aromatic compounds (c) other than the ethyl vinyl aromatic compounds (b).

The copolymer contains the structural units represented by the above $(a_1)$, $(a_2)$ and $(a_3)$ as the repeating unit derived from the divinyl aromatic compound (a). In the structural units represented by the above $(a_1)$, $(a_2)$ and $(a_3)$, $R_{13}$, $R_{14}$, W and Z have the same meanings as described above. But the proportion of each structural unit in the copolymer depends on the types of the divinyl aromatic compounds (a) and the ethylvinylaromatic compound (b), as well as the reaction conditions such as reaction catalyst, reaction temperature and the like.

In the present invention, the divinyl aromatic compound (a) used therein may be selected from the group consisting of, for example, m-divinylbenzene, p-divinylbenzene, 1,2-diisopropenylbenzene, 1,3-diisopropenylbenzene, 1,4-diisopropenylbenzene, 1,3-diisopropenylnaphthalene, 1,4-diisopropenylnaphthalene, 1,5-dii sopropenylnaphthalene, 1,8-diisopropenylnaphthalene, 2,3-diiso-propenylnaphthalene, 2,6-diisopropenylnaphthalene, 2,7-diisopropenylnaphthalene, 4,4'-divinyl-biphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinyl biphenyl, 1,2-divinyl-3,4-dimethylbenzene, 1,3-divinyl-4,5,8-tributylnaphthalene or 2,2'-divinyl-4-ethyl-4'-propylbiphenyl, or a combination of at least two selected therefrom, but not limited to those as mentioned above. Moreover, those mentioned above may be used alone or in combination.

As a preferable specific example of the divinyl aromatic compound (a) to be used, divinylbenzene (both meta and para isomers), divinylbiphenyl (including each isomer) and divinylnaphthalene (including each isomer) are preferred in view of cost and heat resistance of the obtained polymers. More preferred are divinylbenzene (both meta and para isomers) and divinylbiphenyl (including individual isomers). In particular, divinylbenzene (both meta and para isomers) is most preferably used. Among the fields requiring higher heat resistance, divinylbiphenyl (including each isomer) and divinylnaphthalene (including each isomer) are particularly preferable.

In the polyfunctional vinyl aromatic copolymer, the ethyl vinyl aromatic compound used for providing the structural unit (b) for adjusting the compatibility to the vinyl organosilicon resin as component (B) and improving the solvent solubility and processability may be selected from the group consisting of o-ethylvinylbenzene, m-ethylvinylbenzene, p-ethylvinylbenzene, 2-vinyl-2'-ethylbiphenyl, 2-vinyl-3'-ethylbiphenyl, 2-vinyl-4'-ethylbiphenyl, 3-vinyl-2'-ethyl-biphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethyl-naphthalene, 2-vinyl-4-ethylnaphthalene, 2-vinyl-5-ethylnaphthalene, 2-vinyl-6-ethylnaphthalene, 2-vinyl-7-ethylnaphthalene, 2-vinyl-8-ethylnaphthalene, but not limited to those as mentioned above. Moreover, those mentioned above may be used alone or in combination. The introduction of a structural unit derived from the component (b) into the polyfunctional vinyl aromatic copolymer not only can prevent gelation of the copolymer, but also can improve the solubility in a solvent. As a preferable specific example, ethyl vinylbenzene (both meta and para isomers) and ethyl vinylbiphenyl (including each isomer) may be exemplified in terms of cost, prevention of gelation, and heat resistance of the obtained cured product.

In order to improve the heat resistance of the cured product of the thermosetting resin composition of the present invention or to improve compatibility with other resins, a monovinyl aromatic compound (c) other than the added ethylvinyl aromatic compound (b) may be added. Preferred compounds is selected from styrene, styrene substituted with an alkyl group other than the ethyl vinyl aromatic compound, and aromatic vinyl compounds substituted with an alkyl group other than the ethyl vinyl aromatic compound, α-alkyl-substituted styrene, α-alkyl-substituted aromatic vinyl compounds, β-alkyl-substituted styrene, alkyl-substituted aromatic vinyl compounds, indene derivatives, acenaphthene derivatives and the like.

As the styrene substituted with an alkyl group on the ring, an alkyl-substituted styrene such as methyl styrene, ethyl styrene or butyl styrene can be used.

Further, styrene substituted with an alkyl group on the ring may be methoxystyrene, ethoxystyrene or butoxystyrene. Further, phenoxystyrene or the like can also be used.

As the aromatic vinyl compound, 2-vinylbiphenyl, 3-vinylbiphenyl, 4-vinylbiphenyl, 1-vinyl-naphthalene or 1-vinylnaphthalene, for example, can be used.

As the aromatic vinyl compound substituted with an alkyl group on the ring, vinyl-propylbiphenyl or vinyl-propylnaphthalene, for example, can be used.

Further, as the a-alkyl substituted styrene, α-methylstyrene, α-ethylstyrene and the like can be used.

As the indene derivatives, an alkyl-substituted indene such as methyl indene, ethyl indene, propyl indene or butyl indene may be used. Further, an alkoxy indene such as methoxy indene, ethoxy indene or butoxy indene in addition to indene can also be used.

As the acenaphthene derivatives, an alkyl-substituted acenaphthene such as methyl acenaphthene and ethyl acenaphthene in addition to hydrazine may be used. Further, a halogenated acenaphthene such as chlorinated acenaphthene or brominated acenaphthene, as well as phenyl acenaphthene may be used.

For the soluble polyfunctional vinyl aromatic copolymer, the monovinyl aromatic compounds as the component (c) are not limited to these listed compounds. These substances may be used alone or in combination.

Among these monovinyl aromatic compounds as the component (c), styrene, α-alkyl-substituted styrene, α-alkyl-substituted aromatic vinyl compounds are preferred from the viewpoint of a large amount of indane structure formation in the skeleton of the polymer. As most preferable specific examples, styrene, α-methylstyrene, 4-isoprene and biphenyl are mentioned in terms of cost and heat resistance of the obtained polymer.

For the soluble polyfunctional vinyl aromatic copolymer, the divinyl aromatic compound as the component (a) is used in an amount of 20 to 99.5 mol. % relative to the sum of the monomers composed of the component (a), the component (b) and the component (c), e.g. 20 mol. %, 25 mol. %, 28 mol. %, 30 mol. %, 35 mol. %, 38 mol. %, 40 mol. %, 45 mol. %, 50 mol. %, 55 mol. %, 60 mol. %, 65 mol. %, 70 mol. %, 80 mol. %, 90 mol. %, 95 mol % or 99 mol. %, preferably 33 to 99 mol. %, more preferably 45 to 95 mol. %, particularly preferably 50 to 85 mol. %. The content of the divinyl aromatic compound (a) of less than 20 mol. % will cause the heat resistance tends to be lowered when the resulting soluble polyfunctional vinyl aromatic copolymer is cured, and thus is not preferable.

Further, for the soluble polyfunctional vinyl aromatic copolymer, the ethyl vinyl aromatic compound as the component (b) is used in an amount of 0.5 to 80 mol. % relative to the sum of the monomers composed of the component (a), the component (b) and the component (c), e.g. 0.5 mol. %, 0.8 mol. %, 1 mol. %, 5 mol. %, 10 mol. %, 15 mol. %, 20 mol. %, 25 mol. %, 30 mol. %, 35 mol. %, 40 mol. %, 45 mol. %, 50 mol. %, 55 mol. %, 60 mol. %, 65 mol. %, 70 mol. %, 75 or 80 mol. %, preferably 1 to 70 mol. %, more preferably 5 to 60 mol. %, particularly preferably 15 to 50 mol. %. The content of the ethyl vinyl aromatic compound (b) of higher than 70 mol. % will cause the heat resistance tends to be lowered when the resulting soluble polyfunctional vinyl aromatic copolymer is cured, and thus is not preferable.

For the soluble polyfunctional vinyl aromatic copolymer, the monovinyl aromatic compound as the component (c) is used in an amount of less than 40 mol. % relative to the sum of the monomers composed of the component (a), the component (b) and the component (c), e.g. 38 mol. %, 35 mol. %, 33 mol. %, 30 mol. %, 28 mol. %, 25 mol. %, 23 mol. %, 20 mol. %, 18 mol. %, 15 mol. %, 13 mol. %, 10 mol. %, 8 mol. %, 5 mol. %, 3 or 1 mol. %, preferably less than 30 mol. %, more preferably less than 25 mol. %, particularly preferably less than 20 mol. %. The content of the monovinyl aromatic compound (c) of higher than or equivalent to 40 mol. % will cause the heat resistance tends to be lowered when the resulting soluble polyfunctional vinyl aromatic copolymer is cured, and thus is not preferable.

In the soluble polyfunctional vinyl aromatic copolymer, the mole fraction of the vinyl group-containing structural unit derived from the divinyl aromatic compound (a) represented by the above formulae $(a_1)$ and $(a_2)$ must satisfy $(a_1)/[(a_1)+(a_2)] \leq 0.5$ e.g. 0.5, 0.6, 0.7, 0.8, 0.9, 0.95, 0.98, preferably greater than or equal to 0.7, particularly preferably greater than or equal to 0.9. The mole fraction of less than 0.5 will cause the heat resistance of the cured product of the resulting copolymer is lowered, so as to take a longer curing time, and thus is not preferable.

Further, the main skeleton of the soluble polyfunctional vinyl aromatic copolymer must have an indane structure represented by the above formula $(a_3)$. In the general formula $(a_3)$, W has an unsaturated aliphatic hydrocarbon group such as vinyl group, an aromatic hydrocarbon group such as phenyl group. The substituents of these hydrocarbon groups may be substituted with 0 to 4 substituents. Further, W may also form a divalent hydrocarbon group such as a naphthalene ring by forming a condensed ring with a benzene ring of an indane structure, wherein the divalent hydrocarbon group may have a substituent.

The indane structure represented by the formula $(a_3)$ is a structural unit which further improves the heat resistance of the soluble polyfunctional vinyl aromatic copolymer and solubility in a solvent, and is produced, under the conditions of a specific solvent, catalyst, temperature and the like while producing a polyfunctional vinyl aromatic group, by making the active site at the end of the growing polymer chain attack the aromatic ring in the structural unit derived from the divinyl aromatic compound and the monovinyl aromatic compound. Preferably, the indane structure is present in an amount of, based on the structural unit of the entire monomers, 0.01 mol. % or more, such as 0.01 mol. %, 0.03 mol. %, 0.05 mol. %, 0.08 mol. %, 0.1 mol. %, 0.2 mol. %, 0.5 mol. %, 0.8 mol. %, 1 mol. %, 1.3 mol. %, 1.5 mol. %, 1.8 mol. %, 2 mol. %, 5 mol. %, 10 mol. %, 15 mol. %, 20 mol. %, 25 or 30 mol. %, more preferably 0.1 mol % or more, further preferably 1 mol % or more, particularly preferably 3 mol % or more, and most preferably 5 mol % or more. The upper limit is preferably 20 mol. % or more, more preferably 15 mol % or less. The main chain skeleton of the polyfunctional vinyl aromatic copolymer without the above-described indane structure will cause the heat resistance and solubility in a solvent are insufficient, and thus is not preferable.

The number average molecular weight Mn of the soluble polyfunctional vinyl aromatic copolymer (converted by using polystyrene measured by gel permeation chromatography) is preferably 600 to 30,000, e.g. 600, 800, 1000, 1500, 2000, 4000, 6000, 8000, 10000, 15000, 20000, 25000 or 30,000, more preferably 600 to 10,000, most preferably 700 to 5,000. The Mn of less than 600 will cause it is difficult to glue or form a thick film since the viscosity of the soluble polyfunctional vinyl aromatic copolymer is too low, and workability is lowered, and thus is not preferable. Further, the Mn of more than 30,000 will cause the gel is easily produced to lower the compatibility with other resin components and the appearance and physical properties are lowered in the case of sizing or film formation, and thus is not preferable.

Further, the value of the number average molecular weight distribution ($M_w/M_n$) of the soluble polyfunctional vinyl aromatic copolymer may be 20 or less, e.g. 20, 18, 15, 10, 8, 6, 4, 2, 1 and the like, preferably 15 or less, more preferably 10 or less, and most preferably 5 or less. If the $M_w/M_n$ value exceeds 20, the viscosity of the thermosetting resin composition of the present invention increases, which deteriorates the processing properties, decreases the compatibility with other resin components, which is accompanied by a decrease in appearance and physical properties.

The soluble polyfunctional vinyl aromatic copolymer used as the component (A) has a metal ion content of preferably 500 ppm or less for each metal ion, e.g. 500 ppm, 400 ppm, 300 ppm, 200 ppm, 100 ppm, 50 ppm, 30 ppm, 20 ppm, 10 ppm, 8 ppm, 5 ppm, 3 ppm or 1 ppm, more preferably 100 ppm or less, further preferably 20 ppm or less, and most preferably 1 ppm or less.

The soluble polyfunctional vinyl aromatic copolymer may also be a substance obtained by copolymerization of trivinyl aromatic compounds, other divinyl compounds and monovinyl compounds, in addition to the above components (a), (b) and (c), without impairing the effects of the present invention.

Specific examples of the trivinyl aromatic compounds include, e.g. 1,2,4-trivinylbenzene, 1,3,5-trivinylbenzene, 1,2,4-triisopropylbenzene, 1,3,5-triisopropylbenzene, 1,3,5-trivinyl-naphthalene, 3,5,4'-trivinylbiphenyl and the like. Further, examples of other divinyl compounds include diene compounds such as butadiene and isoprene. Examples of the other monovinyl compounds include alkyl vinyl ether, aromatic vinyl ether, isobutylene and diisobutylene. These may be used alone or in combination. The amount of these other monomers used is less than 30 mol % based on the total amount of the monomers of the monovinyl aromatic compounds containing the divinyl aromatic compound components (a), (b) and (c).

The soluble polyfunctional vinyl aromatic copolymer can be obtained by, for example, polymerizing the monomer components containing the divinyl aromatic compound (a), the ethyl vinyl aromatic compound (b) and the monovinyl aromatic compound (c) other than the ethyl vinyl aromatic compound (b) in one or more organic solvents having a dielectric constant of 2 to 15, in the presence of the Lewis acid catalyst and the initiator having following formula (a4), at a temperature of 20 to 100° C.,

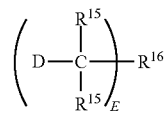

Formula (a4)

wherein $R_{15}$ represents a hydrogen atom or a monovalent hydrocarbon group having 1 to 6 carbon atoms; $R_{16}$ represents an E-valent aromatic hydrocarbon group or an aliphatic hydrocarbon group; D represents a halogen atom, an alkoxy group having 1 to 6 carbon atoms or an acyloxy group; E is an integer from 1 to 6. In the case where there are a plurality of $R_{15}$ and D in one molecule, they may be the same or different, respectively.

The method of recovering the copolymer after the polymerization reaction is stopped is not particularly limited. For example, a method generally used such as a stripping method or precipitation in a poor solvent can be used.

The compounding ratio of the components (A) and (B) above for forming the thermosetting resin composition of the present invention may vary within a wide range, but the compounding amount (wt. %) of the components (A) and (B) must satisfy the following conditions: the compounding amount of the component (A) is 10 to 98 wt. %; and the compounding amount of the component (B) is 2 to 90 wt. %.

In the present invention, if the compounding amount of the component (B) is less than 2 wt. %, the toughness of the thermosetting resin composition after curing is poor; if it exceeds 90 wt. %, the crosslinking density after curing of the thermosetting resin composition is insufficient, and the glass transition temperature is lowered. Since the polyfunctional vinyl aromatic copolymer and the vinyl group-containing organosilicon resin used in the present invention have superior dielectric properties, a cured product excellent in dielectric properties can be formed.

In the thermosetting resin composition of the present invention, there further contains an initiator as the component (C) in addition to the components (A) and (B). Based on 100 parts by weight of the component (A) and the component (B), the component (C) is used in an amount of 0.1 to 10 parts by weight, e.g. 0.1, 0.5, 0.8, 1, 2, 3, 4, 5, 6, 7, 8, 9 or 10 parts by weight, preferably 0.5 to 8 parts by weight, further preferably 1 to 5 parts by weight.

In the present invention, the thermosetting resin composition contains an initiator as the component (C) for the purpose of improving the crosslinking curing effect. Although the polyfunctional vinyl aromatic copolymer and the vinyl organosilicon resin can also be cured under heating conditions, the introduction of the initiator can greatly improve the process efficiency and reduce the processing cost.

Preferably, the component (C) initiator has a half-life temperature $t_{1/2}$ no less than 130° C.; the initiator is a radical initiator.

Preferably, the initiator is selected from the group consisting of dicumyl peroxide, tert-butyl peroxybenzoate, 2,5-bis(2-ethylhexanoylperoxy)-2,5-dimethylhexane, di-(tert-butylperoxy-isopropyl)benzene, 2,4-dichlorobenzoyl peroxide, 2,5-dimethyl-2,5-bis(tert-butylperoxy)hexane, tert-butyl-2-ethylhexyl peroxycarbonate, 2,5-dimethyl-2,5-bis(tert-butylperoxy)-3-hexyne, 4,4-di (tert-butyl-peroxy) butyl valerate, 1,1-bis(tert-butylperoxy)-3,3,5-trimethylcyclohexane, 3,3,5,7,7-pentamethyl-1,2,4-trioxepane, di-tert-butyl peroxide or t-butylperoxybenzene, or a combination of at least two selected therefrom.

In the resin composition of the present invention, the initiator as the component (C) may be used alone or in combination. To use in combination may achieve a better synergistic effect.

In the present invention, the thermosetting resin composition further comprises a filler, wherein the filler comprises an organic filler and/or an inorganic filler.

Preferably, the inorganic filler is selected from the group consisting of crystalline silica, fused silica, spherical silica, hollow silica, glass frit, aluminum nitride, boron nitride, silicon carbide, silicon aluminum silicate, hydrogen hydroxide aluminum, magnesium hydroxide, titanium dioxide, barium titanate, barium titanate, zinc oxide, zirconium oxide, aluminum oxide, barium oxide, magnesium oxide, barium sulfate, talc, clay, calcium silicate, calcium carbonate and mica, or a combination of at least two selected therefrom.

Preferably, the organic filler is selected from the group consisting of polytetrafluoroethylene powder, polyphenylene sulfide, polyetherimide, polyphenylene ether and polyethersulfone powder, or a combination of at least two selected therefrom.

Further, the present invention does not limit the shape and particle diameter of the inorganic filler. The particle diameter generally used ranges from 0.01 to 50 μm, e.g. 0.01 μm, 0.05 μm, 0.08 μm, 0.1 μm, 0.2 μm, 0.5 μm, 1 μm, 3 μm, 5 μm, 8 μm, 10 μm, 15 μm, 20 μm, 25 μm, 30 μm, 35 μm, 40 μm, 45 μm or 50 μm, preferably 0.01 to 20 μm, more preferably 0.01 to 10 μm. The inorganic filler within such particle size range is more easily dispersed in the resin liquid.

Further, the amount of the filler to be used in the thermosetting resin composition is not particularly limited. Based on 100 parts by weight of the component (A) component (B), the filler is preferably used in an amount of 5 to 400 parts by weight for example, e.g. 5, 10, 20, 30, 40, 50, 60, 70, 80, 90, 100, 110, 120, 130, 140 or 150, 200, 250, 300, 350 or 400 parts by weight, more preferably 5 to 200 parts by weight, further preferably 5 to 150 parts by weight.

Preferably, the thermosetting resin composition further comprises a flame retardant, wherein the flame retardant may be a bromine-containing flame retardant or a halogen-free flame retardant.

It is determined by the necessity of flame retardancy to comprise a flame retardant in the thermosetting resin composition of the present invention, so as to make the cured resin product have flame retardant properties and meet the requirements of UL 94 V-0. The added flame retardant as needed is not particularly limited, and it is preferred that the dielectric properties are not affected.

Preferably, the bromine-containing flame retardant is selected from the group consisting of decabromodiphenyl ether, decabromodiphenylethane, ethylene bistetrabromophthalimide and brominated polycarbonate, or a combination of at least two selected therefrom. The optional commercial bromine flame retardants are HT-93, HT-93W, HP-8010 or HP-3010, but are not limited to the above.

Preferably, the halogen-free flame retardant is selected from the group consisting of phosphorus-containing halogen-free flame retardants, nitrogen-containing halogen-free flame retardants and silicon-containing halogen-free flame retardants, or a combination of at least two selected therefrom;

Preferably, the halogen-free flame retardant is selected from the group consisting of tris(2,6-dimethylphenyl)phosphine, 10-(2,5-dihydroxyphenyl)-9,10-dihydro-9-oxa-10-phospha-phenanthrene-10-oxide, 2,6-bis(2,6-dimethylphenyl)phosphinobenzene and 10-phenyl-9,10-dihydro-9-oxa-10-phosphaphenanthrene-10-oxide, phenoxyphosphine cyanide compound, phosphate and polyphosphate, or a combination of at least two selected therefrom;

The optional commercial halogen-free flame retardants are SP-100, PK-200, PK-202, LR-202, LR-700, OP-930, OP-935 and LP-2200, but not limited to the above.

In the present invention, the amount of the flame retardant is determined according to the UL 94 V-0 level of the cured product, and is not particularly limited. In terms of heat resistance, dielectric properties, and hygroscopicity of the cured product, the flame retardant is used in an amount of 5 to 80 parts by weight, e.g. 5, 8, 10, 20, 30, 40, 50, 60, 70 or 80 parts by weight, preferably 10 to 60 parts by weight, more preferably 15 to 40 parts by weight, based on 100 parts by weight of the components (A)+(B). When the amount of flame retardant added is insufficient, a good flame retardant effect cannot be achieved; when the flame retardant is added in an amount of more than 80 parts by weight, there will be risks of lowered heat resistance and increased water absorption of the system. In addition, the dielectric performance of the system will also get worse.

Preferably, the thermosetting resin composition further comprises additives for solving some problems. The additives are selected form the group consisting of an antioxidant, a heat stabilizer, a light stabilizer, a plasticizer, a lubricant, a flow modifier, an anti-drip agent, an anti-blocking agent, an antistatic agent, a flow promoter, a processing aid, a substrate binder, a mold release agent, a toughening agent, a low shrinkage additive and a stress relief additive, or a combination of at least two selected therefrom.

In the thermosetting resin composition of the present invention, the amount of the additive is not particularly limited. Based on 100 parts by weight of the components (A)+(B), the amount of the additive is preferably 0.1 to 10 parts by weight, e.g. 0.1, 0.5, 0.8, 1, 2, 3, 4, 5, 6, 7, 8, 9 or 10 parts by weight, more preferably 0.5 to 8 parts by weight, further preferably 1 to 5 parts by weight.

In another aspect, the present invention provides a method for producing a thermosetting resin composition as described above, wherein the method comprising blending, stirring, and mixing by a known method with the soluble polyfunctional vinyl aromatic copolymer, polybutadiene resin, free radical initiator, powder filler, as well as various flame retardants and various additives.

In another aspect, the present invention provides a resin varnish obtained by dissolving or dispersing the thermosetting resin composition as described above in a solvent.

The solvent in the present invention is not particularly limited, and specific examples thereof include alcohols such as methanol, ethanol and butanol, ethers such as ethyl cellosolve, butyl cellosolve, ethylene glycol-methyl ether, carbitol and butyl carbitol, ketones such as acetone, butanone, methyl ethyl ketone, methyl isobutyl ketone and cyclohexanone, aromatic hydrocarbons such as toluene, xylene and mesitylene, esters such as ethoxyethyl acetate and ethyl acetate, nitrogen-containing solvents such as N,N-dimethylformamide, N,N-dimethylacetamide and N-methyl-2-pyrrolidone. These solvents may be used alone or in combination of two or more. Preferred are the combination of aromatic hydrocarbon solvents such as toluene, xylene, and mesitylene with acetone solvents, such as acetone, butanone, methyl ethyl ketone, methyl isobutyl ketone and cyclohexanone. The amount of the solvent to be used can be selected by those person skilled in the art according to his own experience, so that the obtained resin varnish can reach a viscosity suitable for use.

An emulsifier may be added during the process of dissolving or dispersing the resin composition as described above in a solvent. By dispersing by an emulsifier, the powder filler or the like can be uniformly dispersed in the glue.

In another aspect, the present invention provides a prepreg comprising a substrate and the thermosetting resin composition as described above adhered to the substrate by impregnation and drying.

The prepreg of the present invention may also be referred to as the prepreg, which may also be obtained by impregnating the substrate in the resin varnish as described above, and then heating and drying to remove the organic solvent and partially curing the resin composition in the substrate. The substrate described in the present invention may also be referred to as a reinforcing material.

Preferably, the substrate is a woven or nonwoven fabric made of organic fibers, carbon fibers or inorganic fibers.

Preferably, the organic fibers comprise aramid fibers such as Kevlar fibers from DuPont.

The woven fabric or the non-woven fabric obtained from the inorganic fibers is not particularly limited. Preferably, the woven fabric or non-woven fabric made from the inorganic fiber-made contains 50 to 99.9 wt. % (e.g. 50%, 55%, 58%, 60%, 65%, 70%, 75%, 80%, 85%, 88%, 90%, 95% or 99%) of $SiO_2$, 0-30 wt. % (e.g. 0%, 5%, 10%, 15%, 20%, 25% or 30%) of CaO, 0-20 wt. % (e.g. 0%, 5%, 10%, 15% or 20%) of $Al_2O_3$, 0-25 wt. % (e.g. 0%, 5%, 10%, 15%, 20% or 25%) of $B_2O_3$, and 0-5 wt. % (e.g. 0%, 0.5%, 1%, 2%, 3%, 4% or 5%) of MgO, but is not limited to the above components. Preferably, the substrate (reinforcing material) is preferably a braided fiber cloth, optionally E-Glass, T-Glass, NE-Glass, L-Glass, Q-Glass, D-Glass, particularly preferably NE-Glass. The thickness of the substrate to be used is also not particularly limited.

The content of the resin used to impregnate the above substrate is preferably 30% by mass or more, such as 30% by mass, 35% by mass, 40% by mass, 50% by mass, 60% by mass or more, of the resin content in the prepreg. Since the dielectric constant of the substrate tends to be higher than that of the resin composition, the content of the resin composition component in the prepreg prefers the above content in order to lower the dielectric constant of the laminate obtained from these prepregs.

Preferably, the prepreg described above has a drying temperature of 80 to 200° C., such as 80° C., 90° C., 110° C., 120° C., 130° C., 140° C., 150° C., 170° C., 190° C. or 200° C., a drying time of 1-30 min, e.g. 1, 5, 8, 13, 17, 21, 24, 28 or 30 min.

In another aspect, the invention provides a laminate comprising at least one prepreg as described above.

In another aspect, the present invention provides a metal foil-clad laminate comprising one or at least two laminated prepregs as described above, and metal foil on one or both sides of the laminated prepregs.

Preferably, the metal foil is a copper foil. Preferably, the copper foil is an electrolytic copper foil or a rolled copper foil having a surface roughness of less than 5 μm, e.g. 4, 3, 2, 1, 0.8, 0.5 μm or the like. It can improve and increase the signal loss of laminate materials used in high frequency and high speed printed circuit boards.

Meanwhile, in order to improve the adhesion of one side of the copper foil prepreg, it is further preferred that the copper foil is chemically treated with a silane coupling agent selected from the group consisting of epoxy silane coupling agent, vinyl silane coupling agent and acrylate-based silane coupling agents, or a mixture of any two selected therefrom.

In another aspect, the present invention provides a high frequency high speed circuit board comprising one or at least two laminated prepregs as described above.

Specifically, the high speed circuit board of the present invention is produced by the following method:
overlapping at least one prepreg as described above, placing copper foils on the upper and lower sides of the prepreg, and lamination-molding. The overlapping is preferably an automated stacking operation to make the process operation easier.

The lamination-molding is preferably vacuum lamination-molding, and the vacuum lamination-molding can be carried out by a vacuum laminator. The lamination time is 70-120 min, such as 70, 75, 80, 85, 90, 95, 100, 105, 110, 115 or 120 min; the lamination temperature is 180-220° C., e.g. 180° C., 185° C., 190° C., 195° C., 200° C., 205° C., 210° C., 215° C. or 220° C.; the pressure of the lamination is 20-60 kg/cm$^2$, such as 20, 25, 30, 35, 40, 45, 50, 55, 58, 60 kg/cm$^2$.

The electronic circuit substrate prepared by the method of the invention has good toughness and maintains high glass transition temperature, low water absorption rate, excellent dielectric property and excellent heat and humidity resistance, and is very suitable for processing high-multilayer printed circuit boards.

In addition, in order to further improve the application of the materials in the high-frequency high-speed field, the copper foil used in the production of copper foil-clad laminates of the present invention may be selected from an electrolytic copper foil or a rolled copper foil, which has a surface roughness of less than 5 μm and can improve and increase the signal loss of the laminate material used in high-frequency high-speed printed circuit boards. At the same time, in order to improve the adhesion of one side of the copper foil prepreg, the copper foil can also be chemically treated with a silane coupling agent. The silane coupling agent is selected from the group consisting of epoxy silane coupling agent, vinyl silane coupling agent and acrylate-based silane coupling agent, or a mixture of more selected therefrom. The purpose is to provide a bonding force between the copper foil and the substrate to prevent the risk of dropped wire and pad during the use of the printed circuit board.

As compared with the prior art, the present invention has the following beneficial effects.

The vinyl group-containing organosilicon resin is used as a crosslinking agent of the soluble polyfunctional vinyl aromatic copolymer, and the resin composition has a high crosslinking density after curing, and can provide a high glass transition temperature of the circuit substrate. The brittleness of the polyfunctional vinyl aromatic copolymer after curing is remarkably improved, and the prepared circuit substrate has better toughness to improve the drilling processability of the PCB, which is advantageous for improving the reliability of the multilayer printed circuit board. In addition, the organosilicon resin containing vinyl group does not contain a polar group in the molecular structure, which ensure that the circuit board has low water absorption and excellent dielectric properties. In short, the prepreg and the copper-clad laminate prepared from the resin composition containing the vinyl-containing organosilicon resin and the soluble polyfunctional vinyl aromatic copolymer have good toughness and maintain high glass transition temperature, low water absorption, excellent dielectric properties and heat and humidity resistance, and are suitable for application in the field of high-frequency high-speed printed circuit boards and suitable for multi-layer printed circuit board processing.

Embodiments

The technical solution of the present invention will be further described below by way of specific embodiments. It should be understood by those skilled in the art that the present invention is not to be construed as limited.

PREPARATION EXAMPLE 1

Into a three-necked flask was added a mixture of diethylenetetramethyldisiloxane, concentrated hydrochloric acid, deionized water and ethanol. A mechanical stirrer was turned on, and then triethyl phenyl silicate was rapidly dropped under rapid stirring and heated reflux for hydrolytic condensation. After a certain period of hydrolysis, toluene was added to extract. The reaction solution was poured into a separatory funnel, and allowed to stand for stratification. The aqueous layer was separated. The oil layer was washed with water to neutrality, distilled, and dried to remove the solvent toluene to obtain, by hydrolysis-condensation of a monofunctional vinyl-containing siloxane unit (M unit) and a trifunctional phenyl-containing siloxane unit (T unit), a MT vinyl organosilicon resin V-10 having a molecular weight Mn of 2,000, containing an unsaturated double bond and having a three-dimensional network structure.

PREPARATION EXAMPLE 2

Into a three-necked flask was added a mixture of diethylenetetramethyldisiloxane, concentrated hydrochloric acid, deionized water and ethanol. A mechanical stirrer was turned on, and then triethyl phenyl silicate and ethyl orthosilicate was rapidly dropped under rapid stirring and heated reflux for hydrolytic condensation. After a certain period of hydrolysis, toluene was added to extract. The reaction solution was poured into a separatory funnel, and allowed to stand for stratification. The aqueous layer was separated. The oil layer was washed with water to neutrality, distilled, and dried to remove the solvent toluene to obtain, by hydrolysis-condensation of a monofunctional vinyl-containing siloxane unit (M unit), a trifunctional phenyl-containing siloxane unit (T unit) and a tetrafunctional siloxane unit (Q unit), a MTQ vinyl organosilicon resin V-20 having a molecular weight Mn of 1,900, containing an unsaturated double bond and having a three-dimensional network structure.

PREPARATION EXAMPLE 3

Into a three-necked flask was added a mixture of diethylenetetramethyldisiloxane, concentrated hydrochloric acid, deionized water and ethanol. A mechanical stirrer was turned on, and then triethyl phenyl silicate and dimethyl diethoxysilane was rapidly dropped under rapid stirring and heated reflux for hydrolytic condensation. After a certain period of hydrolysis, toluene was added to extract. The reaction solution was poured into a separatory funnel, and allowed to stand for stratification. The aqueous layer was separated. The oil layer was washed with water to neutrality, distilled, and dried to remove the solvent toluene to obtain, by hydrolysis-condensation of a monofunctional vinyl-containing siloxane unit (M unit), a difunctional methyl-containing siloxane unit (D unit) and a trifunctional phenyl-containing siloxane unit (T unit), a MDT vinyl organosilicon resin V-30 having a molecular weight Mn of 1,800, containing an unsaturated double bond and having a three-dimensional network structure.

PREPARATION EXAMPLE 4

Into a three-necked flask was added a mixture of diethylenetetramethyldisiloxane, concentrated hydrochloric acid, deionized water and ethanol. A mechanical stirrer was turned on, and then dimethyl diethoxysilane and ethyl orthosilicate was rapidly dropped under rapid stirring and heated reflux for hydrolytic condensation. After a certain period of hydrolysis, toluene was added to extract. The reaction solution was poured into a separatory funnel, and allowed to stand for stratification. The aqueous layer was separated. The oil layer was washed with water to neutrality, distilled, and dried to remove the solvent toluene to obtain, by hydrolysis-condensation of a monofunctional vinyl-containing siloxane unit (M unit), a difunctional methyl-containing siloxane unit (D unit) and a tetrafunctional siloxane unit (Q unit), a MDQ vinyl organosilicon resin V-40 having a molecular weight Mn of 1,900, containing an unsaturated double bond and having a three-dimensional network structure.

PREPARATION EXAMPLE 5

Into a three-necked flask was added a mixture of concentrated hydrochloric acid, deionized water and ethanol. A mechanical stirrer was turned on, and then tiethyl vinyl silicate and ethyl orthosilicate was rapidly dropped under rapid stirring and heated reflux for hydrolytic condensation. After a certain period of time of hydrolysis, toluene was added to extract. The reaction solution was poured into a separatory funnel, and allowed to stand for stratification. The aqueous layer was separated. The oil layer was washed with water to neutrality, distilled, and dried to remove the solvent toluene to obtain, by hydrolysis-condensation of a monotrifunctional vinyl-containing siloxane unit (T unit) and a tetrafunctional siloxane unit (Q unit), a TQ vinyl organosilicon resin V-60 having a molecular weight Mn of 1,900, containing an unsaturated double bond and having a three-dimensional network structure.

PREPARATION EXAMPLE 6

0.481 mol (68.4 mL) of vinylbenzene, 0.0362 mol (5.16 mL) of ethylvinylbenzene, 63 mL of a dichloroethane solution of 1-chlorovinylbenzene (40 mmol) (having a concentration of 0.634 mmol/mL), 11 mL of a dichloroethane solution of brominated tetra-n-butylammonium (1.5 mmol) (having a concentration of 0.135 mmol/mL), and 500 mL of dichloroethane were placed in a 1000 mL flask. 1.5 mL of a dichloroethane solution of 1.5 mmol $SnCl_4$ was added at 70° C. (having a concentration of 0.068 mmol/mL), and the reaction lasts 1 hour. After the polymerization reaction of a small amount of methanol which was foamed with nitrogen, the reaction mixture was poured into a large amount of methanol at room temperature to precipitate a polymer. The obtained polymer was washed with methanol, filtered, dried, and weighed to obtain 54.6 g of copolymer (49.8 wt. % yield)

The obtained polymer VOD-A had a Mw of 4,180, a Mn of 2560, and a Mw/Mn of 1.6. It was detected by using a JNM-LA600 type nuclear magnetic resonance spectroscopic device manufactured by JEOL that the polymer VOD-A was found to contain 52 mol. % of structural units derived from divinylbenzene and 48 mol. % of structural units derived from ethylvinylbenzene. Further, it is understood that there was an indane structure in the copolymer VOD-A. The indane structure was present in an amount of 7.5 mol. % relative to the structural units of all monomers. Moreover, the molar fraction of the structural unit represented by the formula ($a_1$) was 0.99 with respect to the total amount of the structural units represented by the above formulae ($a_1$) and ($a_2$).

The copolymer VOD-A was soluble in toluene, xylene, THF, dichloromethane, dichloroethane, chloroform, and no gel formation was observed.

PREPARATION EXAMPLE 7

0.481 mol (68 mL) of vinylbenzene, 0.362 mol (52 mL) of ethylvinylbenzene, 47 mL of a dichloroethane solution of 1-chlorovinylbenzene (30 mmol) (having a concentration of 0.634 mmol/mL), 65 mL of a dichloroethane solution of chlorinated tetra-n-butylammonium (2.25 mmol) (having a concentration of 0.035 mmol/mL), and 500 mL of dichloroethane were placed in a 1000 mL flask. 22 mL of a dichloroethane solution of 1.5 mmol $SnCl_4$ was added at 70° C. (having a concentration of 0.068 mmol/mL), and the reaction lasts 1 hour. After the polymerization reaction of a small amount of methanol which was foamed with nitrogen, the reaction mixture was poured into a large amount of methanol at room temperature to precipitate a polymer. The obtained polymer was washed with methanol, filtered, dried, and weighed to obtain 67.4 g of copolymer VOD-B (61.4 wt. % yield)

The obtained polymer VOD-B had a Mw of 7,670, a Mn of 3680, and a Mw/Mn of 2.1. It was detected by using a JNM-LA600 type nuclear magnetic resonance spectroscopic device manufactured by JEOL that the polymer VOD-B was found to contain 51 mol. % of structural units derived from divinylbenzene and 49 mol. % of structural units derived from ethylvinylbenzene. Further, it is understood that there was an indane structure in the copolymer VOD-B. The indane structure was present in an amount of 7.5 mol. % relative to the structural units of all monomers. Moreover, the molar fraction of the structural unit represented by the formula ($a_1$) was 0.99 with respect to the total amount of the structural units represented by the above formulae ($a_1$) and ($a_2$).

The copolymer VOD-B was soluble in toluene, xylene, THF, dichloromethane, dichloroethane, chloroform, and no gel formation was observed.

PREPARATION EXAMPLE 8

0.0481 mol (6.84 mL) of vinylbenzene, 0.0362 mol (5.16 mL) of ethylvinylbenzene, 12.0 mg of a cobalt chain transferring agent having the following formula ($a_5$)

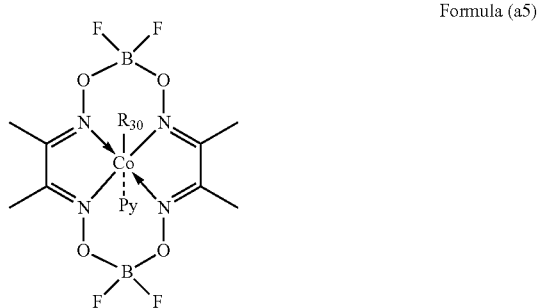

Formula (a5)

(wherein $R_{30}$ is an isopropyl group; Py is pyridyl group) and 150 ml of tetrahydrofuran were placed in a 300 ml flask. 2,2'-azobis(2,4-dimethylvaleronitrile) was added at 50° C., and reacted for 72 hours. The reaction mixture was poured into a large amount of methanol at room temperature to precipitate a polymer. The obtained polymer was washed with methanol, filtered, dried, and weighed to obtain 3.15 g of copolymer VOD-C (28.8 wt. % yield)

The obtained polymer VOD-c contained Gel, so it is soluble only in THF solvent. It had a Mw of 94,600, a Mn of 12,800, and a Mw/Mn of 7.4. It was detected by using a JNM-LA600 type nuclear magnetic resonance spectroscopic device manufactured by JEOL that the polymer VOD-C was found to contain 58 mol. % of structural units derived from divinylbenzene and 42 mol. % of structural units derived from ethylvinylbenzene. Further, it is understood that there was no indane structure in the copolymer VOD-C. Moreover, the molar fraction of the structural unit represented by the formula ($a_1$) was 0.25 with respect to the total amount of the structural units represented by the above formulae ($a_1$) and ($a_2$).

PREPARATION EXAMPLE 9

Into a reaction vessel equipped with a stirrer, a dropping funnel and a thermometer, 40 mL of 2-propanol (IPA) as a solvent and a 5% aqueous solution of tetramethylammonium hydroxide (TMAH aqueous solution) as a basic catalyst were placed. 15 mL of IPA and 12.69 g of 3-methacryloxypropyltrimethoxysilane (MTMS:SZ-6300, manufactured by Toray Dow Corning Silicone Co., Ltd.) were added to the dropping funnel. While stirring in the reaction vessel, the IPA solution of MTMS was added dropwise at room temperature in 30 minutes. After the completion of the dropwise addition of MTMS, the mixture was stirred for 2 hours without heating. After stirring for 2 hours, the solvent was removed under reduced pressure. 50 mL of toluene was used for dissolving. The reaction solution was washed with saturated saline until neutral, and then dehydrated with anhydrous magnesium sulfate. Anhydrous magnesium sulfate was filtered, and 8.6 g of a hydrolyzed product (cage silsesquioxane A) was obtained by concentration.

TABLE 1

Materials in the examples and comparison examples

| Manufacturer | Product name or brand | Material description |
|---|---|---|
| Gelest | DMS-V05 | Linear vinyl organosilicon resin |
| Wuda Silicone | WD-V4 | Cyclic vinyl organosilicon resin |
| Shangdong Dayi Chemical | DY-VMQ102 | MQ vinyl organosilicon resin |
| Zhengzhou Alpha | S12836 | Octavinyl-T8-silsesquioxane |
| Self-made | V-10 | Octavinyl MT organosilicon resin |
| Self-made | V-20 | Vinyl phenyl MTQ organosilicon resin |
| Self-made | V-30 | Vinyl phenyl MDT organosilicon resin |
| Self-made | V-40 | Vinyl phenyl MDQ organosilicon resin |
| Self-made | V-50 | Vinyl TQ organosilicon resin |
| Self-made | Copolymer VOD-A | Polyfunctional vinyl aromatic copolymer |
| Self-made | Copolymer VOD-B | Polyfunctional vinyl aromatic copolymer |
| Self-made | Copolymer VOD-C | Polyfunctional vinyl aromatic copolymer |
| Self-made | Cage silsesquioxane A | Terminal (meth)acryloyl cage silsesquioxane A |
| Albemarle | BT-93W | Ethylene bis-tetrabromophthalimide |
| Mitsubishi Gas | OPE-25T-1 | Vinyl modified polyphenylene ether resin |
| Asahi Kasei | H1041 | Hydrogenated styrene butadiene block copolymer |
| Xinqiao Chemical | DCP | Dicumyl peroxide |
| Admatechs | S0-C2 | D50: 0.5 um spherical silicon |
| Nittobo | 2116NE | NE-glass fiberglass cloth |

EXAMPLE 1

80.0 parts by weight of the polyfunctional vinyl aromatic copolymer VOD-A, 20.0 parts by weight of linear vinyl silicone resin DMS-V05, 3.0 parts by weight of a radical initiator DCP, 25 parts by weight of a bromine flame retardant BT-93W, and 60 parts by weight of the silica fine powder S0-C2 were dissolved in a toluene solvent, and adjusted to a suitable viscosity. NE-glass fiber cloth (Nittobo, model 2116NE) was impregnated with the resin varnish, controlled to be suitable for piece weight by a clamping axis, and dried in an oven to remove the toluene solvent, so as to prepare a 2116 prepreg. 6 sheets of 2116 prepregs and 12 sheets of 2116 prepregs were respectively overlapped, and were coated with a copper foil having a thickness of 1 OZ on both the upper and lower sides, vacuum laminated and cured for 120 min in a press at a curing pressure of 50 kg/cm$^2$, and a curing temperature of 200° C., to prepare high-speed circuit boards with two thickness specifications (6*2116-0.76 mm plates for testing comprehensive performance, 12*2116-1.52 mm thick plates for testing mechanical properties). The physical properties of the prepared copper foil substrate were tested, and the results are shown in Table 2 in detail.

EXAMPLE 2

It was the same as in the process of Example 1, except for that the organosilicon resin component was replaced by a cyclic vinyl organosilicon resin WD-V4. The physical properties of the prepared copper foil substrate were tested, and the results are shown in Table 2 in detail.

EXAMPLE 3

It was the same as in the process of Example 1, except for that the organosilicon resin component was replaced by MQ vinyl organosilicon resin DY-VMQ102. The physical properties of the prepared copper foil substrate were tested, and the results are shown in Table 2 in detail.

EXAMPLE 4

It was the same as in the process of Example 1, except for that the organosilicon resin component was replaced by Octavinyl-T8-silsesquioxane S12836. The physical properties of the prepared copper foil substrate were tested, and the results are shown in Table 2 in detail.

EXAMPLE 5

It was the same as in the process of Example 1, except for that the organosilicon resin component was replaced by vinyl phenyl MT organosilicon resin V10. The physical properties of the prepared copper foil substrate were tested, and the results are shown in Table 2 in detail.

EXAMPLE 6

It was the same as in the process of Example 1, except for that the organosilicon resin component was replaced by vinyl phenyl MTQ organosilicon resin V20. The physical properties of the prepared copper foil substrate were tested, and the results are shown in Table 2 in detail.

EXAMPLE 7

It was the same as in the process of Example 1, except for that the organosilicon resin component was replaced by vinyl phenyl MDT organosilicon resin V30. The physical properties of the prepared copper foil substrate were tested, and the results are shown in Table 2 in detail.

EXAMPLE 8

It was the same as in the process of Example 1, except for that the organosilicon resin component was replaced by vinyl phenyl MDQ organosilicon resin V30. The physical properties of the prepared copper foil substrate were tested, and the results are shown in Table 2 in detail.

EXAMPLE 9

It was the same as in the process of Example 1, except for that the organosilicon resin component was replaced by vinyl TQ organosilicon resin V50. The physical properties of the prepared copper foil substrate were tested, and the results are shown in Table 2 in detail.

EXAMPLE 10

It was the same as in the process of Example 1, except for that the ratio of the polyfunctional vinyl aromatic copolymer VOD-A and linear vinyl organosilicon resin DMS-V05 had changed from the original weight ratio of 80:20 to 40:60. The physical properties of the prepared copper foil substrate were tested, and the results are shown in Table 3 in detail.

EXAMPLE 11

It was the same as in the process of Example 1, except for that the ratio of the polyfunctional vinyl aromatic copolymer VOD-A and linear vinyl organosilicon resin DMS-V05 had changed from the original weight ratio of 80:20 to 13:87. The physical properties of the prepared copper foil substrate were tested, and the results are shown in Table 3 in detail.

EXAMPLE 12

It was the same as in the process of Example 1, except for that the ratio of the polyfunctional vinyl aromatic copolymer VOD-A and linear vinyl organosilicon resin DMS-V05 had changed from the original weight ratio of 80:20 to 93:7. The physical properties of the prepared copper foil substrate were tested, and the results are shown in Table 3 in detail.

EXAMPLE 13

It was the same as in the process of Example 1, except for that the polyfunctional vinyl aromatic copolymer VOD-A was replaced with the polyfunctional vinyl aromatic copolymer VOD-B. The physical properties of the prepared copper foil substrate were tested, and the results are shown in Table 3 in detail.

COMPARISON EXAMPLE 1

80.0 parts by weight of the polyfunctional vinyl aromatic copolymer VOD-A, 3.0 parts by weight of a radical initiator DCP, 25 parts by weight of a bromine flame retardant BT-93W, and 60 parts by weight of the silica fine powder S0-C2 were dissolved in a toluene solvent, and adjusted to a suitable viscosity. NE-glass fiber cloth (Nittobo, model 2116NE) was impregnated with the resin varnish, controlled to be suitable for piece weight by a clamping axis, and dried in an oven to remove the toluene solvent, so as to prepare a 2116 prepreg. 6 sheets of 2116 prepregs and 12 sheets of 2116 prepregs were respectively overlapped, and were coated with a copper foil having a thickness of 1 OZ on both the upper and lower sides, vacuum laminated and cured for 120 min in a press at a curing pressure of 50 kg/cm$^2$, and a curing temperature of 200° C., to prepare high-speed circuit boards with two thickness specifications (6*2116-0.76 mm plates for testing comprehensive performance, 12*2116-1.52 mm thick plates for testing mechanical properties). The physical properties of the prepared copper foil substrate were tested, and the results are shown in Table 3 in detail.

COMPARISON EXAMPLE 2

80.0 parts by weight of the polyfunctional vinyl aromatic copolymer VOD-A, 20.0 parts by weight of linear vinyl silicone resin DMS-V05, 3.0 parts by weight of a radical initiator DCP, 25 parts by weight of a bromine flame retardant BT-93W, and 60 parts by weight of the silica fine powder S0-C2 were dissolved in a toluene solvent, and adjusted to a suitable viscosity. NE-glass fiber cloth (Nittobo, model 2116NE) was impregnated with the resin varnish, controlled to be suitable for piece weight by a clamping axis, and dried in an oven to remove the toluene solvent, so as to prepare a 2116prepreg. 6 sheets of 2116 prepregs and 12 sheets of 2116 prepregs were respectively overlapped, and were coated with a copper foil having a thickness of 1 OZ on both the upper and lower sides, vacuum laminated and cured for 120 min in a press at a curing pressure of 50 kg/cm$^2$, and a curing temperature of 200° C., to prepare high-speed circuit boards with two thickness specifications (6*2116-0.76 mm plates for testing comprehensive performance, 12*2116-1.52 mm thick plates for testing mechanical properties). The physical properties of the prepared copper foil substrate were tested, and the results are shown in Table 3 in detail.

COMPARISON EXAMPLE 3

48 parts by weight of the polyfunctional vinyl aromatic copolymer VOD-A, 12 parts by weight of vinyl modified polyphenylene ether resin OPE-2ST-1, 40 parts by weight of hydrogenated styrene butadiene block copolymer H1041, 3.0 parts by weight of a radical initiator DCP, 25 parts by weight of a bromine flame retardant BT-93W, and 60 parts by weight of the silica fine powder S0-C2 were dissolved in a toluene solvent, and adjusted to a suitable viscosity. NE-glass fiber cloth (Nittobo, model 2116NE) was impregnated with the resin varnish, controlled to be suitable for piece weight by a clamping axis, and dried in an oven to remove the toluene solvent, so as to prepare a 2116 prepreg. 6 sheets of 2116 prepregs and 12 sheets of 2116 prepregs were respectively overlapped, and were coated with a copper foil having a thickness of 1 OZ on both the upper and lower sides, vacuum laminated and cured for 120 min in a press at a curing pressure of 50 kg/cm$^2$, and a curing temperature of 200° C., to prepare high-speed circuit boards with two thickness specifications (6*2116-0.76 mm plates for testing comprehensive performance, 12*2116-1.52 mm thick plates for testing mechanical properties). The physical properties of the prepared copper foil substrate were tested, and the results are shown in Table 3 in detail.

COMPARISON EXAMPLE 4

80.0 parts by weight of the polyfunctional vinyl aromatic copolymer VOD-A, 20 parts by weight of the terminal (meth)acryloyl cage silsesquioxane A, 3.0 parts by weight of a radical initiator DCP, 25 parts by weight of a bromine flame retardant BT-93W, and 60 parts by weight of the silica fine powder S0-C2 were dissolved in a toluene solvent, and adjusted to a suitable viscosity. NE-glass fiber cloth (Nittobo, model 2116NE) was impregnated with the resin varnish, controlled to be suitable for piece weight by a clamping axis, and dried in an oven to remove the toluene solvent, so as to prepare a 2116 prepreg. 6 sheets of 2116 prepregs and 12 sheets of 2116 prepregs were respectively overlapped, and were coated with a copper foil having a thickness of 1 OZ on both the upper and lower sides, vacuum laminated and cured for 120 min in a press at a curing pressure of 50 kg/cm$^2$, and a curing temperature of 200° C., to prepare high-speed circuit boards with two thickness specifications (6*2116-0.76 mm plates for testing comprehensive performance, 12*2116-1.52 mm thick plates for testing mechanical properties). The physical properties of the prepared copper foil substrate were tested, and the results are shown in Table 3 in detail.

TABLE 2

| Materials and performances | Example 1 | Example 2 | Example 3 | Example 4 | Example 5 | Example 6 | Example 7 | Example 8 | Example 9 |
|---|---|---|---|---|---|---|---|---|---|
| Copolymer VOD-A | 80 | 80 | 80 | 80 | 80 | 80 | 80 | 80 | 80 |
| Copolymer VOD-B | | | | | | | | | |
| Copolymer VOD-C | | | | | | | | | |
| DMS-V05 | 20 | | | | | | | | |
| WD-V4 | | 20 | | | | | | | |
| DY-VMQ102 | | | 20 | | | | | | |
| S12836 | | | | 20 | | | | | |
| V-10 | | | | | 20 | | | | |
| V-20 | | | | | | 20 | | | |
| V-30 | | | | | | | 20 | | |
| V-40 | | | | | | | | 20 | |
| V-50 | | | | | | | | | 20 |
| OPE-2ST-1 | | | | | | | | | |
| H1041 | | | | | | | | | |
| cage silsesquioxane A | | | | | | | | | |
| DCP | 3.0 | 3.0 | 3.0 | 3.0 | 3.0 | 3.0 | 3.0 | 3.0 | 3.0 |
| BT-93W | 25 | 25 | 25 | 25 | 25 | 25 | 25 | 25 | 25 |
| S0-C2 | 60 | 60 | 60 | 60 | 60 | 60 | 60 | 60 | 60 |
| Tg-DMA (° C.) | 293.1 | 291.2 | 292.6 | 294.3 | 291.2 | 292.1 | 290.8 | 293.1 | 292.5 |
| Td-5% loss (° C.) | 416.2 | 415.3 | 416.3 | 413.2 | 416.3 | 417.3 | 416.5 | 414.2 | 413.5 |
| PCT water absorption rate (%) | 0.14 | 0.15 | 0.15 | 0.16 | 0.16 | 0.15 | 0.16 | 0.15 | 0.15 |
| Dielectric constant (10 GHz) | 3.40 | 3.41 | 3.40 | 3.22 | 3.40 | 3.42 | 3.41 | 3.42 | 3.40 |
| Dielectric loss factor (10 GHz) | 0.0018 | 0.0018 | 0.0020 | 0.0021 | 0.0020 | 0.0020 | 0.0021 | 0.0020 | 0.0021 |
| Pendulum Impact strength (kJ/m$^2$) | 65.352 | 64.521 | 64.821 | 63.241 | 65.102 | 64.851 | 64.654 | 65.254 | 64.568 |
| Drop hammer impact toughness | ◎ | ◎ | ◎ | ◎ | ◎ | ◎ | ◎ | ◎ | ◎ |
| PCT | >300 s | >300 s | >300 s | >300 s | >300 s | >300 s | >300 s | >300 s | >300 s |

TABLE 3

| Materials and performances | Example 10 | Example 11 | Example 12 | Example 13 | Comp. Example 1 | Comp. Example 2 | Comp. Example 3 | Comp. Example 4 |
|---|---|---|---|---|---|---|---|---|
| Copolymer VOD-A | 40 | 13 | 93 | | 100 | | 48 | 80 |
| Copolymer VOD-B | | | | 80 | | | | |
| Copolymer VOD-C | | | | | | 80 | | |

TABLE 3-continued

| Materials and performances | Example 10 | Example 11 | Example 12 | Example 13 | Comp. Example 1 | Comp. Example 2 | Comp. Example 3 | Comp. Example 4 |
|---|---|---|---|---|---|---|---|---|
| DMS-V05 | 60 | 87 | 7 | 20 | | 20 | | |
| WD-V4 | | | | | | | | |
| DY-VMQ102 | | | | | | | | |
| S12836 | | | | | | | | |
| V-10 | | | | | | | | |
| V-20 | | | | | | | | |
| V-30 | | | | | | | | |
| V-40 | | | | | | | | |
| V-50 | | | | | | | | |
| OPE-2ST-1 | | | | | | | 12 | |
| H1041 | | | | | | | 40 | |
| Cage silsesquioxane A | | | | | | | | 20 |
| DCP | 3.0 | 3.0 | 3.0 | 3.0 | 3.0 | 3.0 | 3.0 | 3.0 |
| BT-93W | 25 | 25 | 25 | 25 | 25 | 25 | 25 | 25 |
| S0-C2 | 60 | 60 | 60 | 60 | 60 | 60 | 60 | 60 |
| Tg-DMA (° C.) | 230.2 | 215.2 | 292.1 | 292.1 | 291.6 | 210.3 | 202.6 | 289.3 |
| Td-5% loss (° C.) | 415.2 | 412.3 | 415.2 | 412.3 | 416.2 | 360.2 | 412.3 | 414.2 |
| PCT water absorption rate (%) | 0.16 | 0.15 | 0.15 | 0.15 | 0.14 | 0.15 | 0.25 | 0.15 |
| Dielectric constant (10 GHz) | 3.45 | 3.40 | 3.42 | 3.41 | 3.40 | 3.40 | 3.43 | 3.55 |
| Dielectric loss factor (10 GHz) | 0.0018 | 0.0018 | 0.0019 | 0.0018 | 0.0020 | 0.0020 | 0.0030 | 0.0050 |
| Pendulum Impact strength (kJ/m$^2$) | 65.864 | 66.152 | 62.751 | 65.654 | 45.687 | 58.654 | 55.501 | 54.632 |
| Drop hammer impact toughness | ◎ | ◎ | ◎ | ◎ | Δ | ○ | ○ | ○ |
| PCT | >300 s | >300 s | >300 s | >300 s | >300 s | 10 s; delamination | 2 s; delamination | >300 s |

The test methods for the above characteristics are as follows.

1) Glass transition temperature (Tg): The Tg of the laminate was measured according to the dynamic thermal mechanical analysis (DMA) method specified in IPC-TM-650 2.4.24.4.

2) Thermal decomposition temperature (Td-5% loss): According to the thermogravimetric analysis (TGA), the temperature Td at 5% weight loss of the laminate was measured according to the TGA method specified in IPC-TM-650 2.4.24.6.

3) PCT water absorption rate: After etching the copper foil on the surface of the copper clad laminate, the substrate was dried to weigh the original weight, and then placed in a pressure cooker, treated at 120° C. and 150 KPa for two hours, taken out with a dry cloth, wiped to dry and to weigh the sample after water absorption. PCT water absorption (weight after cooking-weight before cooking)/weight before cooking.

4) Dielectric constant Dk and dielectric loss factor Df: Tested according to the SPDR (Split Post Dielectric Resonator) method at a test frequency of 10 GHz.

5) Pendulum impact strength: Using a simple-supported beam non-metallic material pendulum impact tester. A laminate of about 1.6 mm was made into several 120 mm*10 mm notched samples (notch depth 2 mm). The pendulum was used to impact the sample at a speed of 3.8 m/s. After the sample broke, the absorption work of the pendulum impact tester was read. Finally, the pendulum impact strength was calculated.

6) Drop hammer impact toughness: using the drop hammer impact tester. The drop hammer of the impact tester had a drop height of 100 cm and a weight of 1 Kg. Toughness evaluation: the clearer the cross was, the better the toughness of the product was, represented by the character ◎. If the cross was blurred, it showed that the product had poor toughness and brittleness, which was represented by the character Δ. If the clarity of the cross was between clarity and blur, it indicated that the product had a general toughness, which was represented by the character ○.

7) PCT: After etching the copper foil on the surface of the copper clad plate, the substrate was placed in a pressure cooker, treated at 120° C. and 150 KPa for two hours, and then immersed in a tin furnace at 288° C. When the substrate was layered, the corresponding time was recorded. The evaluation could be ended if bubbles or delamination did not appear after the substrate was in the tin furnace for more than 5 minutes.

Physical Property Analysis

It can be seen from the physical property data in Tables 2 and 3 that Comparison Example 1 discloses that the substrate has a higher glass transition temperature, better electrical properties, lower water absorption ratio, but extremely worst toughness after the polyfunctional vinyl aromatic copolymer VOD-A was used for self-curing. In Comparison Example 3, after the addition of the hydrogenated styrene butadiene block copolymer, the toughness of the substrate was improved, but the glass transition temperature was significantly reduced. Moreover, the delamination and plate blasting appeared, and it had a poor heat and humidity resistance. In Comparison Example 4, the terminal (meth)acryloyl cage-type silsesquioxane A was introduced as a crosslinking agent. It was inferior in dielectric properties due to its high polarity. In Examples 1 to 13, a vinyl organosilicon resin was used as the polyfunctional vinyl aromatic copolymer VOD-A or VOD-B. The cured substrate had good toughness and maintained its high glass transition temperature, low water absorption, excellent dielectric properties and heat and humidity resistance.

As described above, the circuit substrate of the present invention has good toughness as compared with general laminates, and maintains its high glass transition temperature, low water absorption, excellent dielectric properties, and moist heat resistance.

The applicant claims that the thermosetting resin composition of the present invention, prepregs and metal foil-clad laminate prepared therefrom are described by the above embodiments. However, the present invention is not limited to the above embodiments, i.e. it does not mean that the present invention cannot be carried out unless the above embodiments are applied. Those skilled in the art shall know that any modifications of the present invention, equivalent substitutions of the materials selected for use in the present invention, and addition of the auxiliary ingredients, and specific manner in which they are selected, all are within the protection scope and disclosure of the present invention.

What is claimed is:

1. A metal foil-clad laminate, comprising:
   one or at least two laminated prepregs, and metal foils on one side or both sides of the laminated prepreg;
   wherein the prepreg comprises a substrate and a thermosetting resin composition adhered to the substrate by impregnation and drying;
   wherein the substrate is selected from the group consisting of woven or non-woven fabrics prepared from organic fibers, carbon fibers or inorganic fibers;
   wherein the metal foils are copper foils;
   wherein the thermosetting resin composition consists of component (A), component (B), component (C), a filler and a flame retardant;
   component (A) a solvent-soluble polyfunctional vinyl aromatic copolymer having a structural unit derived from monomers comprising divinyl aromatic compound (a) and ethyl vinyl aromatic compound (b), comprising 20 mol. % or more of repeating units derived from divinyl aromatic compound (a), wherein the molar fraction of the vinyl group-containing structural unit derived from the divinyl aromatic compound (a) represented by the following formulae (a1) and (a2) satisfies (a1)/[(a1)+(a2)]≥0.5; the polystyrene-equivalent number average molecular weight Mn measured by gel permeation chromatography is 600 to 30,000; and the ratio of the weight average molecular weight Mw to the number average molecular weight Mn is 20.0 or less,

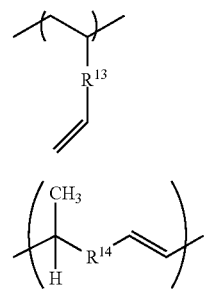

Formula (a1)

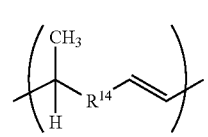

Formula (a2)

wherein $R_{13}$ represents an aromatic hydrocarbon group having 6 to 30 carbon atoms; $R_{14}$ represents an aromatic hydrocarbon group having 6 to 30 carbon atoms;
component (B) a vinyl-containing organosilicon resin; and
component (C) an initiator used in an amount of 0.1 to 10 by weight based on 100 parts by weight of the component (A) and the component (B);
in the thermosetting resin composition, the compounding amount of the component (A) is 13 to 93 wt. %, and the compounding amount of the component (B) is 7 to 87 wt. %, based on the total weight of the components (A) and (B);
the filler is selected from crystalline silica, fused silica, spherical silica, hollow silica, glass frit, aluminum nitride, boron nitride, silicon carbide, hydrogen hydroxide aluminum, magnesium hydroxide, titanium dioxide, barium titanate, zinc oxide, zirconium oxide, aluminum oxide, barium oxide, magnesium oxide, barium sulfate, calcium carbonate, polytetrafluoroethylene powder, polyphenylene sulfide, polyetherimide, and polyethersulfone powder, or combination thereof;
the flame retardant is either a bromine-containing flame retardant or a halogen-free flame retardant; the flame retardant is used in an amount of 5 to 80 parts by weight based on 100 parts by weight of the component (A)+component (B);
wherein the vinyl-containing organosilicon resin is selected from the group consisting of MQ vinyl organosilicon resin, MT vinyl organosilicon resin, MTQ vinyl organosilicon resin, MDT vinyl organosilicon resin, MDQ vinyl organosilicon resin, TT vinyl organosilicon resin and TQ vinyl organosilicon resin, or a combination of at least two selected therefrom.

2. The metal foil-clad laminate according to claim 1, wherein the main chain skeleton of the solvent-soluble polyfunctional vinyl aromatic copolymer has an indane structure represented by the following formula (a3)

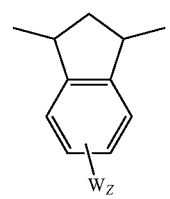

Formula (a3)

wherein W represents a saturated or unsaturated aliphatic hydrocarbon group or an aromatic hydrocarbon group, or an aromatic ring or a substituted aromatic ring fused to a benzene ring; Z is an integer of 0 to 4.

3. The metal foil-clad laminate according to claim 1, wherein the component (A) the solvent-soluble polyfunctional aromatic copolymer further contains a structural unit of monovinyl aromatic compounds (c) other than the ethyl vinyl aromatic compounds (b);
the solvent-soluble polyfunctional vinyl aromatic copolymer has a number average molecular weight Mn of 600-10,000;
the solvent-soluble polyfunctional vinyl aromatic copolymer has a ratio of the weight average molecular weight Mw to the number average molecular weight Mn of less than or equivalent to 15; and
the solvent-soluble polyfunctional vinyl aromatic copolymer has a total content of various metal ions, of less than or equivalent to 500 ppm.

4. The metal foil-clad laminate according to claim 1, wherein
the component (C) initiator has a half-life temperature $t_{1/2}$ of not less than 130° C.; wherein the initiator is a radical initiator;
the initiator is selected from the group consisting of dicumyl peroxide, tert-butyl peroxybenzoate, 2,5-bis(2-ethylhexanoylperoxy)-2,5-dimethylhexane, di-(tert-butylperoxy-isopropyl)benzene, 2,4-dichlorobenzoyl peroxide, 2,5-dimethyl-2,5-bis(tert-butylperoxy) hexane, tert-butyl-2-ethylhexyl peroxycarbonate, 2,5-dimethyl-2,5-bis(tert-butylperoxy)-3-hexyne, 4,4-di(tert-butyl-peroxy)butyl valerate, 1,1-bis(tert-butylperoxy)-3,3,5-trimethylcyclohexane, 3,3,5,7,7-pentamethyl-1,2,4-trioxepane, di-tert-butyl peroxide or t-butylperoxybenzene, or a combination of at least two selected therefrom.

5. The metal foil-clad laminate according to claim 1, wherein the MQ organosilicon resin represents a compound having the general formula of $(R_5R_6R_7SiO_{1/2})_x(SiO_{4/2})_y$ wherein $1 \leq x \leq 100$; $1 \leq y \leq 100$; $2 \leq x+y \leq 200$, and $0.1 \leq x/y \leq 4$; at least one of $R_5$, $R_6$ and $R_7$ is a vinyl-containing organic functional group, and the remaining two are independently selected from the group consisting of substituted or unsubstituted C1-C8 linear chain alkyl group, substituted or unsubstituted C1-C8 branched chain alkyl group and substituted or unsubstituted phenyl group;
the MT vinyl organosilicon resin having the following structure $(R_8R_9R_{10}SiO_{1/2})_e(R_{11}SiO_{3/2})_f$ wherein $3 \leq e \leq 100$; $1 \leq f \leq 100$; $4 \leq e+f \leq 200$, and $0.1 \leq e/f \leq 3$; $R_8$, $R_9$, $R_{10}$ and $R_{11}$ are each independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_8$, $R_9$, $R_{10}$ and $R_{11}$ is a substituted or unsubstituted C2-C10 vinyl-containing organic functional group;
the MTQ vinyl organosilicon resin having the following structure $(R_{12}R_{13}R_{14}SiO_{1/2})_g(R_{15}SiO_{3/2})_h(SiO_{4/2})_i$ wherein $1 \leq g \leq 100$; $1 \leq h \leq 100$; $1 \leq i \leq 100$, and $3 \leq g+h+i \leq 300$; $R_{12}$, $R_{13}$, $R_{14}$ and $R_{15}$ are independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_{12}$, $R_{13}$, $R_{14}$ and $R_{15}$ is a substituted or unsubstituted C2-C10 vinyl-containing organic functional group;
the MDT vinyl organosilicon resin having the following structure $(R_{16}R_{17}R_{18}SiO_{1/2})_j(R_{19}R_{20}SiO_{3/2})_k(R_{21}SiO_{3/2})_l$ wherein $1 \leq j \leq 100$; $1 \leq k \leq 100$; $1 \leq l \leq 100$, and $3 \leq j+k+l \leq 300$; $R_{16}$, $R_{17}$, $R_{18}$, $R_{19}$, $R_{20}$ and $R_{21}$ are independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_{16}$, $R_{17}$, $R_{18}$, $R_{19}$, $R_{20}$ and $R_{21}$ is a substituted or unsubstituted C2-C10 vinyl-containing organic functional group;
the MDQ vinyl organosilicon resin having the following structure $(R_{22}R_{23}R_{24}SiO_{1/2})_p(R_{25}R_{26}SiO_{3/2})_q(SiO_{4/2})_s$ wherein $1 \leq p \leq 100$; $1 \leq q \leq 100$; $1 \leq s \leq 100$, and $3 \leq p+q+s \leq 300$; $R_{22}$, $R_{23}$, $R_{24}$, $R_{25}$ and $R_{26}$ are independently selected from the group consisting of substituted or unsubstituted C1-C8 linear chain alkyl group, substituted or unsubstituted C1-C8 branched chain alkyl group, substituted or unsubstituted phenyl group and substituted or unsubstituted C2-C10 vinyl-containing organic functional groups, or a combination of at least two selected therefrom; and at least one of $R_{22}$, $R_{23}$, $R_{24}$, $R_{25}$ and $R_{26}$ is a substituted or unsubstituted C2-C10 vinyl-containing organic functional group;
the TT vinyl organosilicon resin having the following structure $(R_{27}SiO_{3/2})_t$ wherein $6 \leq t \leq 12$, and t is an even number; $R_{27}$ is a substituted or unsubstituted C2-C10 vinyl-containing organic functional group;
the TQ vinyl organosilicon resin having the following structure $(R_{28}SiO_{3/2})_u(SiO_{4/2})_v$ wherein $4 \leq u \leq 100$; $1 \leq v \leq 100$, and $4 \leq u/v \leq 10$; $R_{28}$ is a substituted or unsubstituted C2-C10 vinyl-containing organic functional group.

* * * * *